(12) United States Patent
Matsuoka et al.

(10) Patent No.: US 9,105,585 B2
(45) Date of Patent: Aug. 11, 2015

(54) ETCHING METHOD

(71) Applicant: Tokyo Electron Limited, Tokyo (JP)

(72) Inventors: Hironori Matsuoka, Miyagi (JP); Hiroto Ohtake, Miyagi (JP); Kosuke Kariu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/254,149

(22) Filed: Apr. 16, 2014

(65) Prior Publication Data

US 2014/0308817 A1 Oct. 16, 2014

(30) Foreign Application Priority Data

Apr. 16, 2013 (JP) .................................. 2013-085942

(51) Int. Cl.
*H01L 21/302* (2006.01)
*H01L 21/311* (2006.01)

(52) U.S. Cl.
CPC .... *H01L 21/31116* (2013.01); *H01L 21/31105* (2013.01); *H01J 2237/3346* (2013.01)

(58) Field of Classification Search
USPC ......... 438/198, 199, 700, 706, 710, 712, 718, 438/719, 720, 723, 726; 216/58, 69, 70
See application file for complete search history.

(56) References Cited

U.S. PATENT DOCUMENTS

| 6,337,285 | B1 * | 1/2002 | Ko ................................. 438/714 |
| 6,649,531 | B2 * | 11/2003 | Cote et al. ..................... 438/714 |
| 6,830,977 | B1 * | 12/2004 | Jono et al. ..................... 438/296 |
| 7,265,060 | B2 * | 9/2007 | Tsai et al. ...................... 438/737 |
| 2006/0051927 | A1 * | 3/2006 | Takami ......................... 438/307 |

FOREIGN PATENT DOCUMENTS

JP 2010-098220 A 4/2010

* cited by examiner

*Primary Examiner* — Lan Vinh
(74) *Attorney, Agent, or Firm* — Pearne & Gordon LLP

(57) ABSTRACT

An etching method can selectively etch a second region formed of silicon oxide in a target object with respect to a first region formed of silicon in the target object. The etching method includes (a) processing the target object with plasma of a first processing gas containing fluorocarbon and fluorohydrocarbon by generating the plasma of the first processing gas with a microwave, and (b) after the processing of the target object with the plasma of the first processing gas, processing the target object with plasma of a second processing gas containing fluorocarbon by generating the plasma of the second processing gas with the microwave.

10 Claims, 15 Drawing Sheets

ETCHING METHOD

CROSS-REFERENCE TO RELATED APPLICATION

This application claims the benefit of Japanese Patent Application No. 2013-085942 filed on Apr. 16, 2013, the disclosures of which are incorporated herein by reference.

TECHNICAL FIELD

The embodiments described herein pertain generally to an etching method, and more particularly, to a method of selectively etching a second region formed of silicon oxide in a target object with respect to a first region formed of silicon in the target object.

BACKGROUND

In a manufacturing process of a semiconductor device, some of multiple regions formed of different semiconductor materials are selectively etched. By way of example, with respect to a first region formed of silicon in a target object, a second region formed of silicon oxide in the target object is selectively etched. Such an etching method is described in, for example, Japanese Patent Laid-open Publication No. 2010-098220 (Patent Document 1).

To be specific, Patent Document 1 describes a method of selectively etching a region formed of silicon oxide with plasma of a processing gas containing fluorocarbon such as $C_4F_6$ and $O_2$ with respect to a region formed of silicon. Further, in the same document, it is described that $SF_6$ is used instead of $O_2$.

In the etching method described in the Patent Document 1, the region formed of the silicon oxide is etched with active species from the fluorocarbon while protecting the region formed of the silicon by a CF-based deposit generated from fluorocarbon in the processing gas. To be specific, the fluorocarbon active species (hereinafter, referred to as "CF active species") are deposited on a target object, and the silicon oxide is etched through a sputtering effect of ions in the CF active species. To be more specific, oxygen contained in the silicon oxide are bonded to carbon contained in the ions of the fluorocarbon, so that the oxygen are separated from the silicon oxide. Further, fluorine generated when the carbon is separated from the ions of the fluorocarbon is bonded to silicon generated when the oxygen is separated. Thus, the silicon oxide is etched.

Patent Document 1: Japanese Patent Laid-open Publication No. 2010-098220

In the conventional etching method describe above, when the region formed of the silicon oxide is etched, the region formed of the silicon are also etched. Therefore, there has been demanded a technique of suppressing the region formed of the silicon from being etched and also improving etching selectivity of the region formed of the silicon oxide with respect to the region formed of the silicon.

SUMMARY

In view of the foregoing, example embodiments provide an etching method of selectively etching a second region formed of silicon oxide in a target object with respect to a first region formed of silicon in the target object. In the conventional etching method, for a certain time period (hereinafter, referred to as "initial time period") from when etching of a region formed of silicon oxide is started, a deposition rate of fluorocarbon on a region formed of silicon is low, so that the region formed of silicon is etched. The etching method in accordance with the example embodiments is based on the conventional etching method.

The etching method in accordance with the example embodiments includes (a) processing the target object with plasma of a first processing gas containing fluorocarbon and fluorohydrocarbon by generating the plasma of the first processing gas with a microwave, and (b) after the processing of the target object with the plasma of the first processing gas, processing the target object with plasma of a second processing gas containing fluorocarbon by generating the plasma of the second processing gas with the microwave.

According to this method, during the initial time period, i.e., during the process (a), fluorocarbon active species (hereinafter, referred to as "CF active species") are generated. Further, during the process (a), hydrogen in the fluorohydrocarbon is bonded to fluorine of the CF active species. Thus, active species in which an amount of carbon atoms is greater than that of fluorine atoms are generated. A deposition rate of such active species is high. As a result, it is possible to form a film of protecting the first region formed of silicon during the initial time period. Then, during the process (b), the target object is processed with the plasma of the second processing gas containing fluorocarbon. According to this method, it is possible to form a protective film on the target object during the initial time period, so that it is possible to suppress the first region from being etched and also possible to increase etching selectivity of the second region with respect to the first region.

Further, the second processing gas may not contain a fluorohydrocarbon gas or may contain a fluorohydrocarbon gas in a smaller amount than the fluorohydrocarbon contained in the first processing gas. In the example embodiment, the fluorohydrocarbon may include at least one of $CH_3F$ and $CH_2F_2$.

In the example embodiment, the first region may be a fin region of a fin-type field effect transistor and the second region may be formed around the fin region. In this example embodiment, silicon oxide buried around the fin region can be etched, so that an upper portion of the fin region can be exposed.

Herein, in a plasma source different from a microwave, e.g., in a plasma source of a capacitively coupled plasma processing apparatus, the fluorocarbon may be excessively dissociated, so that the CF active species are deposited in an excessive amount on the target object. Therefore, it is required to attract ions onto the second region to pass through a film based on the CF active species on the second region. To do so, it is required to increase bias power for attracting ions to the target object. However, if a flow rate of the processing gas containing the fluorocarbon and the bias power are increased, a large amount of the silicon oxide may remain, particularly, around a bottom portion of a sidewall of the fin region. Meanwhile, if a microwave is used as a plasma source, an electron temperature on the target object can be lowered as compared with plasma generated in the capacitively coupled plasma processing apparatus. Further, by using the microwave, it is possible to suppress the fluorocarbon from being excessively dissociated. As a result, it is possible to decrease an amount of the silicon oxide remaining around the bottom portion of the sidewall of the fin region and also possible to perform the etching process with high selectivity.

As explained above, in accordance with the various aspects and example embodiments, it is possible to suppress the first region formed of silicon from being etched and also possible to improve etching selectivity of the second region formed of silicon oxide with respect to the first region.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
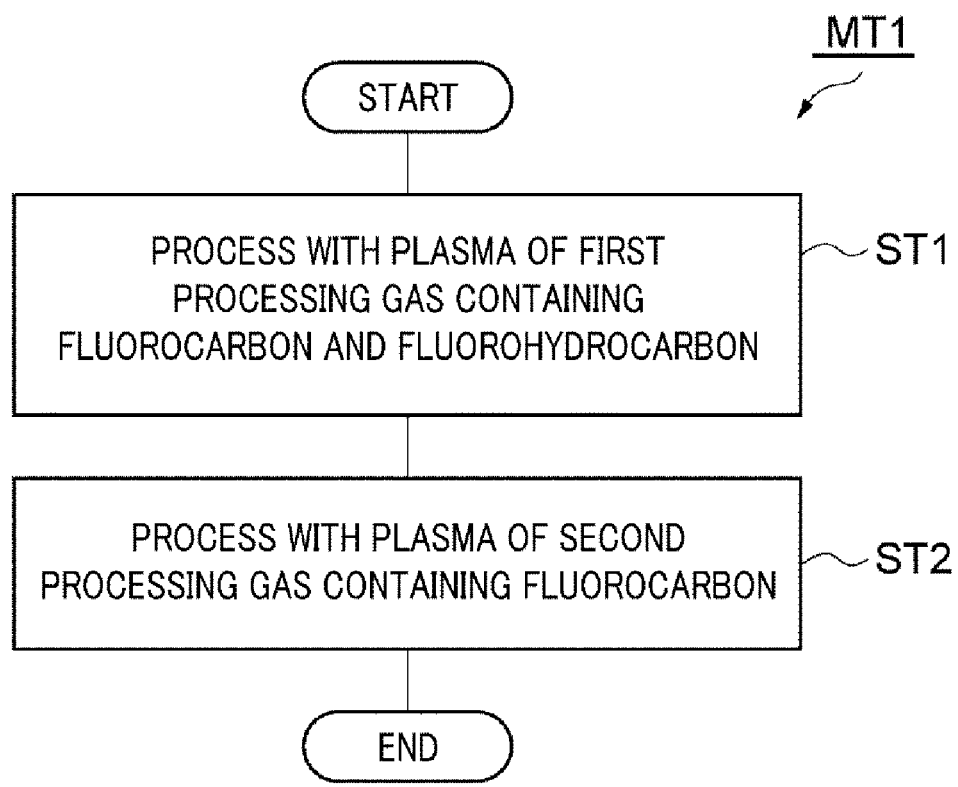
FIG. 1 is a flowchart for describing an etching method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing an etching method in accordance with an example embodiment. A method MT1 as illustrated in FIG. 1 is to selectively etch a second region formed of silicon oxide in a target object with respect to a first region formed of silicon in the target object, and includes a process ST1 and a process ST2. The method as illustrated in FIG. 1 can be applied to any target object as long as it includes a first region formed of silicon and a second region formed of silicon oxide. By way of example, the method as illustrated in FIG. 1 can be applied to a target object as illustrated in FIG. 2.

Figure 2:
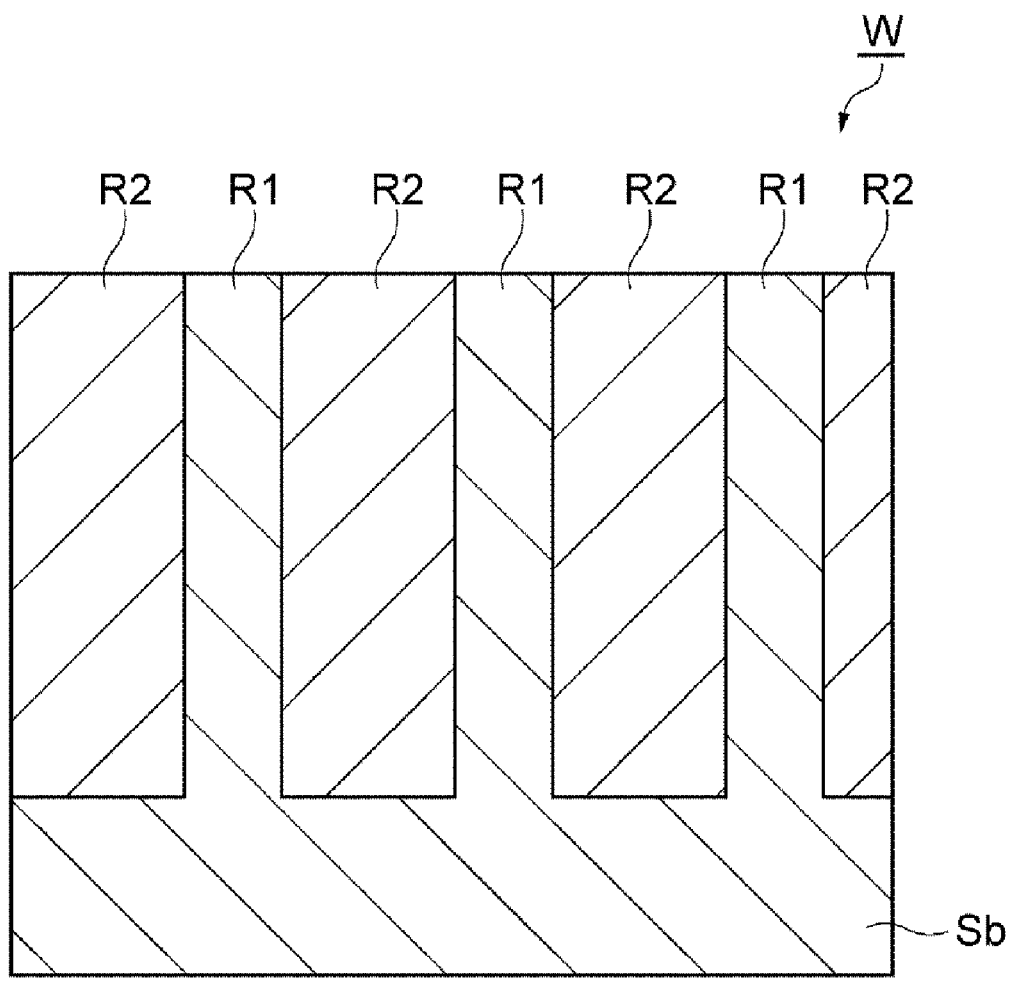
FIG. 2 is a cross sectional view illustrating a example target object to which the method as illustrated in FIG. 1 can be applied.

The target object (hereinafter, referred to as "wafer") W as illustrated in FIG. 2 includes a substrate region Sb, a first region R1, and a second region R2. The substrate region Sb is formed of, for example, silicon. In the wafer W as illustrated in FIG. 2, multiple first regions R1 are formed on the substrate region Sb. The multiple first regions R1 may be formed of polycrystalline silicon. The first regions R1 have a substantially rectangular parallelepiped shape, and are arranged on a main surface of the substrate region Sb. The first region R1 may be used as a fin region of a fin-type field effect transistor (FinFET). The second region R2 may be formed of silicon oxide ($SiO_2$). In the wafer W as illustrated in FIG. 2, the second region R2 is buried between the adjacent first regions R1. Hereinafter, a process performed on the wafer W will be explained in detail with respect to, for example, the method MT1 as illustrated in FIG. 1.

In the method MT1, a process ST1 (Process with plasma of first processing gas containing fluorocarbon and fluorohydrocarbon) is first performed. In the process ST1, plasma of a first processing gas containing fluorocarbon and fluorohydrocarbon is generated by using a microwave. In the process ST1, the wafer W is processed with the plasma of the first processing gas. In the example embodiment, the fluorocarbon is $C_4F_6$, and the fluorohydrocarbon is $CH_3F$. The fluorocarbon may contain carbon and fluorine at any ratio as long as it is formed of carbon and fluorine. Further, the fluorohydrocarbon may be $CH_2F_2$ or both of $CH_3F$ and $CH_2F_2$. The first processing gas may contain a rare gas such as at least one of He and Ar, and an oxygen gas such as $O_2$ together with the fluorocarbon and the fluorohydrocarbon.

Figure 3:
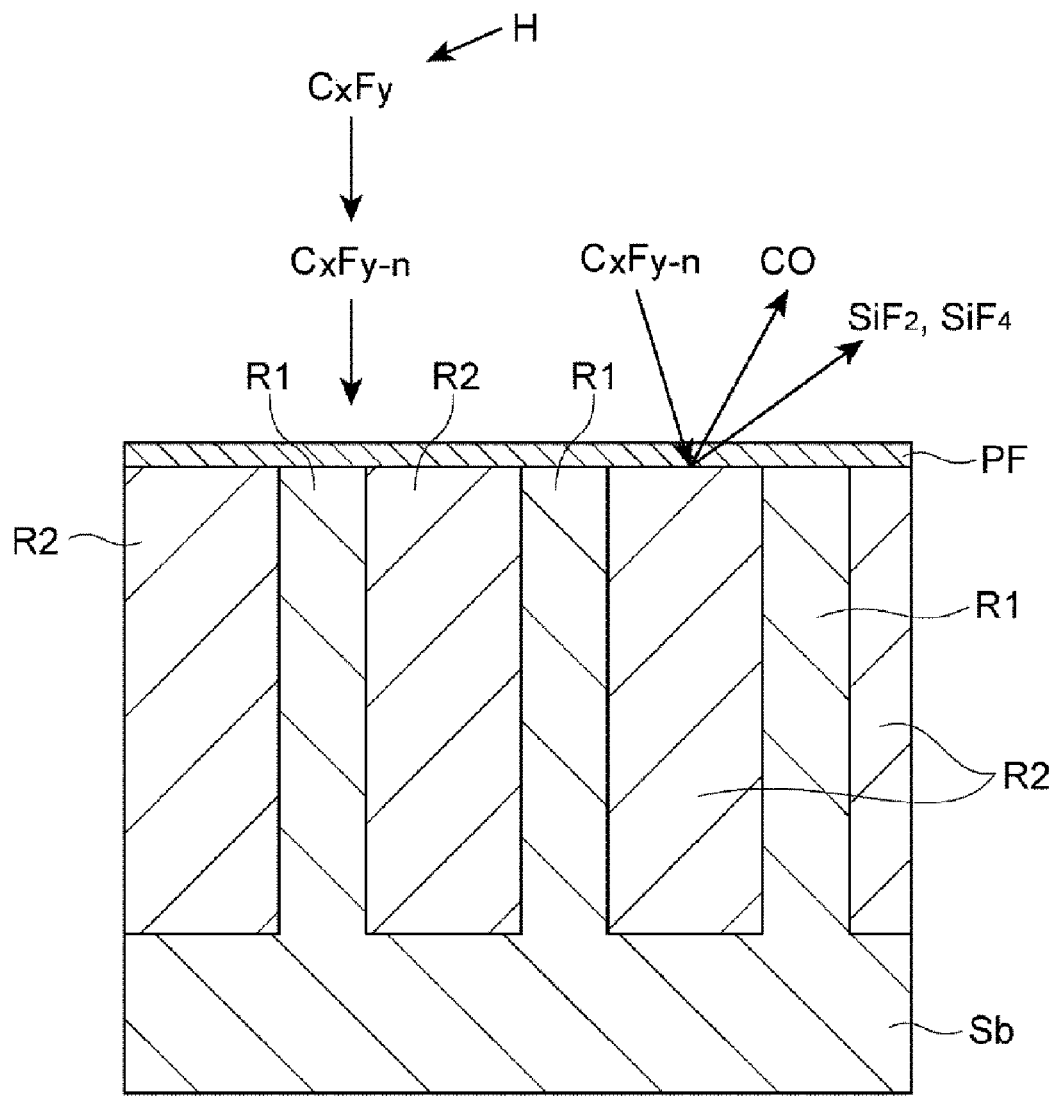
FIG. 3 is a diagram for explaining a process ST1.

FIG. 3 is a diagram for explaining the process ST1. As illustrated in FIG. 3, in the process ST1, active species (hereinafter, referred to as "$C_xF_y$ active species") are generated by dissociation of the fluorocarbon in the first processing gas, and hydrogen active species are generated by dissociation of the fluorohydrocarbon. In drawings, "$C_xF_y$" represents the $C_xF_y$ active species, and "H" represents the hydrogen active species generated by dissociation of the fluorohydrocarbon.

The hydrogen active species are bonded to fluorine in the $C_xF_y$ active species, so that an amount of carbon atoms with respect to fluorine atoms in the $C_xF_y$ active species is increased. Resultant active species (hereinafter, referred to as "$C_xF_{y-n}$ active species") are represented by "$C_xF_{y-n}$", and contain more carbon compared to the $C_xF_y$ active species. Since the $C_xF_{y-n}$ active species contain a relatively great amount of carbon, a deposition rate is high and the $C_xF_{y-n}$ active species are deposited on the wafer W even during an initial time period, i.e., a certain short time period from when etching by the method MT1 is started. Thus, in the method MT1, a protective film PF is formed on a surface of the wafer W during the initial time period.

Further, in the process ST1, ions in at least one of the $C_xF_y$ active species and the $C_xF_{y-n}$ active species are attracted to the wafer W, so that the second region R2 is etched. To be specific, carbon in the ions is bonded to oxygen in the silicon oxide of the second region R2, so that a CO compound is generated to be discharged. Furthermore, after the oxygen is separated, remaining silicon of the second region R2 is bonded to fluorine in the ions. Resultant $SiF_2$ or $SiF_4$ is generated to be discharged. Thus, the second region R2 is etched.

Referring to FIG. 1 again, in the method MT1, the process ST2 (Process with plasma of second processing gas containing fluorocarbon) is subsequently preformed. In the process ST2, plasma of a second processing gas containing fluorocarbon is generated by using a microwave. In the example embodiment, the fluorocarbon is $C_4F_6$. The fluorocarbon may contain carbon and fluorine at any ratio as long as it is formed of carbon and fluorine. The second processing gas may contain a rare gas such as at least one of He and Ar, and an oxygen gas such as $O_2$ together with the fluorocarbon. The second processing gas does not contain fluorohydrocarbon. Otherwise, the second processing gas may contain fluorohydrocarbon in a smaller amount than that of the fluorohydrocarbon contained in the first processing gas.

Figure 4:
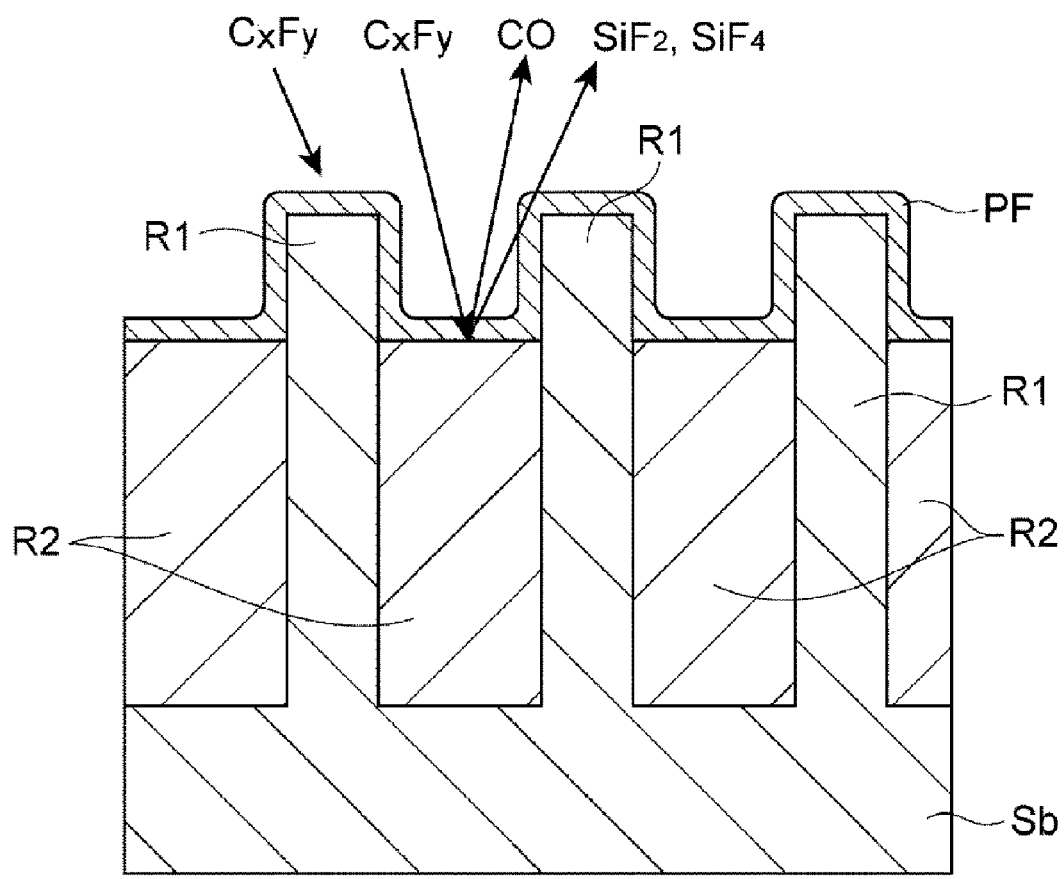
FIG. 4 is a diagram for explaining a process ST2.

FIG. 4 is a diagram for explaining the process ST2. In the process ST2, $C_xF_y$ active species are generated by dissociation of the fluorocarbon in the second processing gas to be deposited on the wafer W. Thus, the protective film PF is formed. Further, in the same manner as the process ST1, the second region R2 is etched. To be specific, ions in the $C_xF_y$ active species attracted to the wafer W, so that the second region R2 is etched. To be more specific, carbon in the ions is bonded to oxygen in the silicon oxide of the second region R2, so that a CO compound is generated to be discharged. Furthermore, after the oxygen is separated, remaining silicon of the second region R2 is bonded to fluorine in the ions. Resultant $SiF_2$ or $SiF_4$ is generated to be discharged, so that the second region R2 is etched.

Further, in the process ST2, even if fluorohydrocarbon is not supplied, or even if a small amount of fluorohydrocarbon is supplied, a sufficient deposition rate of the fluorocarbon on the wafer W can be obtained. Furthermore, in the process ST2, etching selectivity of the second region R2 with respect to the first region R1 can be obtained.

According to the method MT1, even during the initial time period, the protective film PF can be formed on the wafer W, so that etching of the first region R1 formed of silicon can be suppressed. As a result, etching selectivity of the second region R2 with respect to the first region R1 can be improved. In particular, edge portions of upper portion of the fin region as the first region R1 illustrated in FIG. 2 is apt to be etched. If the edge portions are etched to be inclined, etching efficiency of the inclined edge portions through the sputtering effect of the ions becomes higher. Therefore, the fin region can be easily etched. However, according to the method MT1, since the protective film PF can be formed during the initial time period, the silicon oxide around the fin region can be etched while suppressing the fin region from being etched.

Figure 5A:
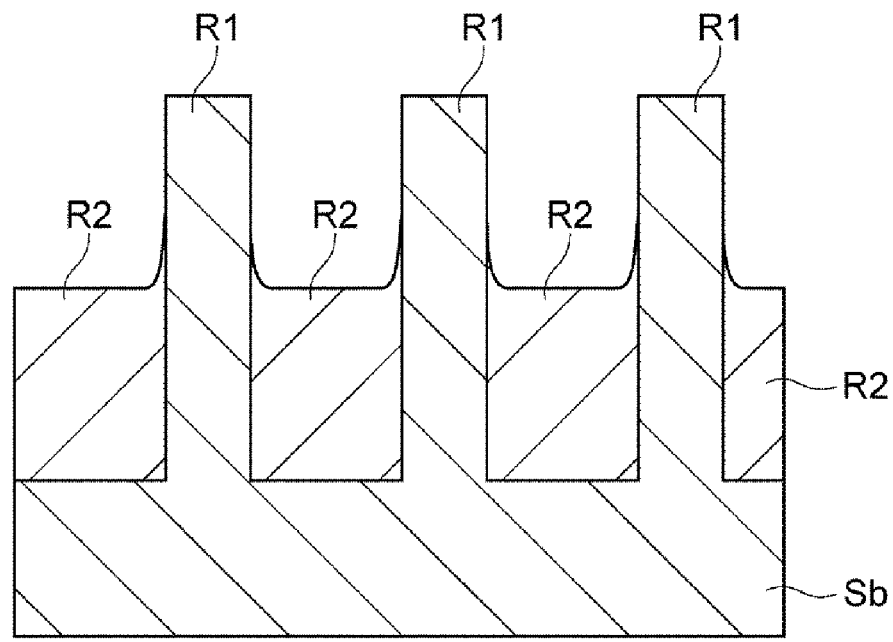
FIG. 5A and FIG. 5B provide a schematic cross sectional view of a target object after etching by a method MT1 and a schematic cross sectional view of a target object after etching by a capacitively coupled plasma processing apparatus, respectively.
Figure 5B:
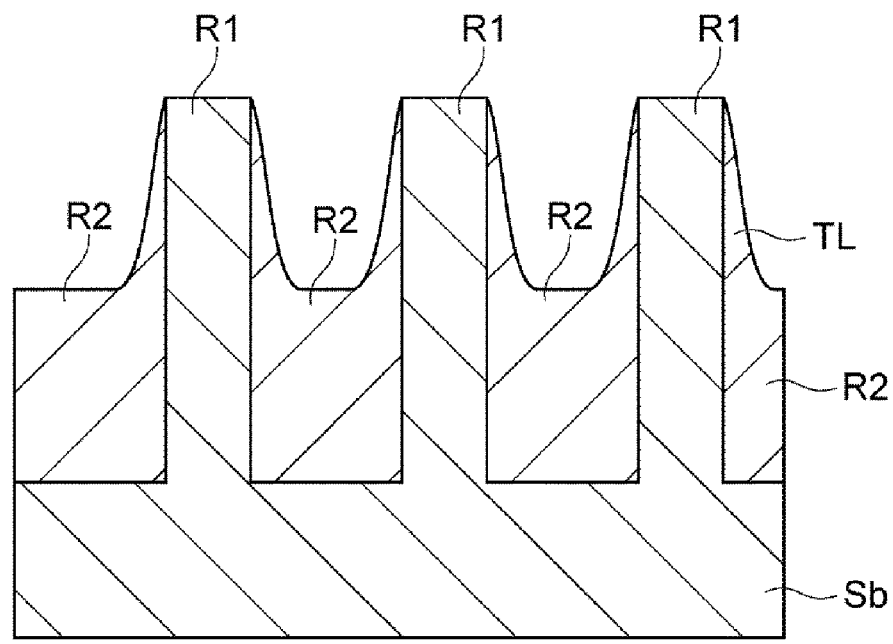

Further, in the method MT1, the microwave is used as a plasma source configured to generate plasma. In a plasma source different from a microwave, e.g., in a plasma source of a capacitively coupled plasma processing apparatus, the fluorocarbon may be excessively dissociated, so that a deposit based on the CF active species is deposited in an excessive amount on the wafer W. Therefore, it is required to attract ions onto the second region R2 to pass through the protective film PF on the second region R2. To do so, it is required to increase bias power for attracting ions to the wafer W. However, if a flow rate of the processing gas containing the fluorocarbon and the bias power are increased, a large amount of the silicon oxide may remain, particularly, around a bottom portion of a sidewall of the fin region R1. To be specific, as illustrated in FIG. 5B, the silicon oxide remains around the sidewall of the fin region R1, and particularly, as represented by a reference numeral TL in FIG. 5B, an amount of the silicon oxide remaining around the bottom portion of the sidewall of the fin region R1 is increased.

Meanwhile, in the method MT1, since the microwave is used as the plasma source, an electron temperature on the target object can be lowered as compared with plasma generated in a capacitively coupled plasma processing apparatus. Further, by using the microwave, it is possible to suppress the fluorocarbon from being excessively dissociated. As a result, as illustrated in FIG. 5A, it is possible to decrease an amount of the silicon oxide remaining around the bottom portion of the sidewall of the fin region R1.

Figure 6:
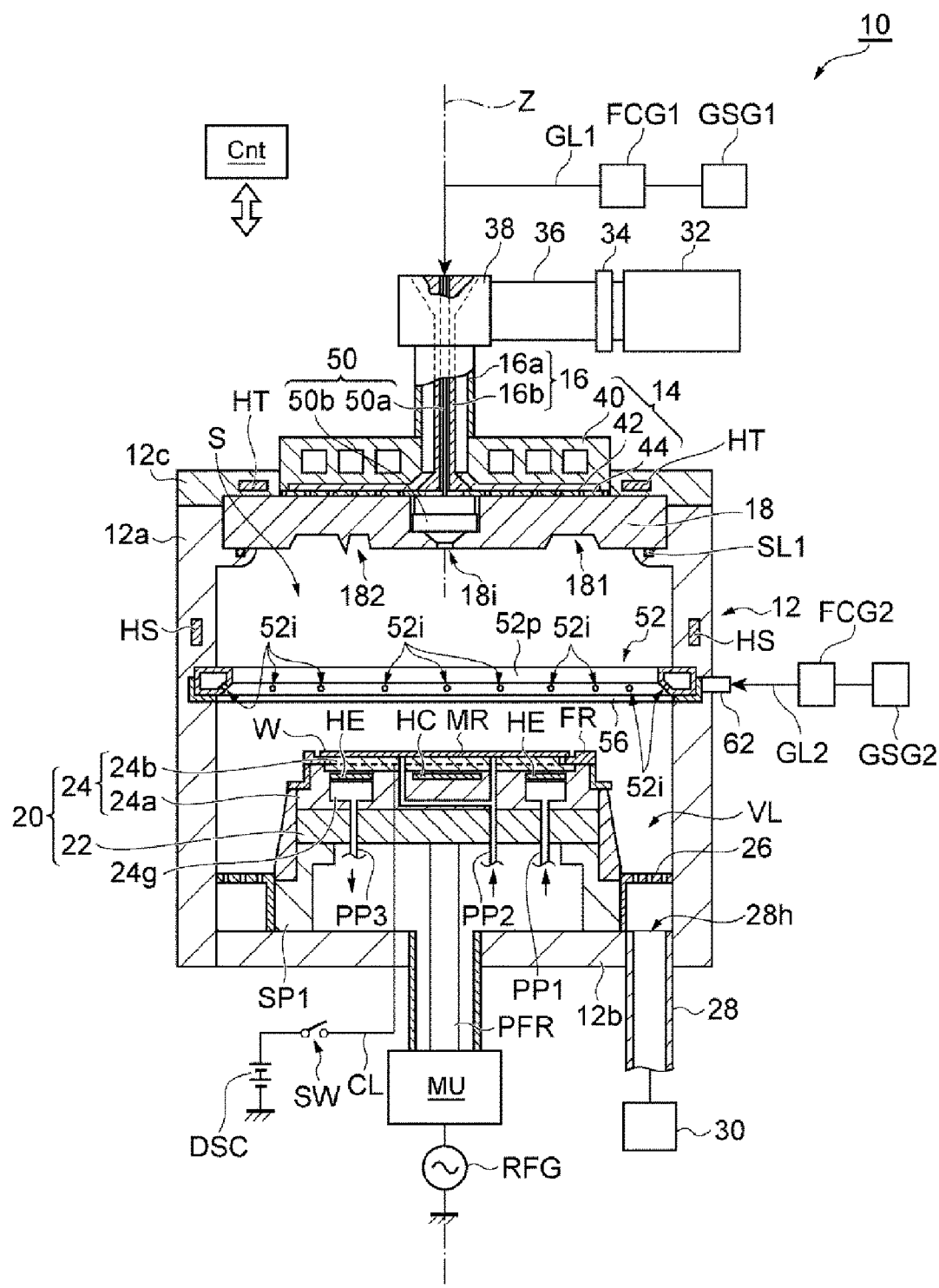
FIG. 6 is a schematic cross sectional view of a plasma processing apparatus in accordance with the example embodiment.

Hereinafter, an example of a plasma processing apparatus in which the method MT1 can be performed will be explained. FIG. 6 is a schematic cross sectional view of a plasma processing apparatus in accordance with the example embodiment.

A plasma processing apparatus 10 illustrated in FIG. 6 includes a processing chamber 12. In the processing chamber 12, a processing space S for accommodating the wafer W is formed. The processing chamber 12 may include a sidewall 12a, a bottom portion 12b, and a ceiling portion 12c.

The sidewall 12a has a substantially cylindrical shape extending in a direction in which an axis line Z extends (hereinafter, referred to as "axis line Z direction"). An inner diameter of the sidewall 12a is, for example, about 540 mm. The bottom portion 12b is provided at a lower end side of the sidewall 12a. An upper end of the sidewall 12a has an opening. The opening of the upper end of the sidewall 12a is closed by a dielectric window 18. The dielectric window 18 is held between the upper end of the sidewall 12a and the ceiling portion 12c. Between the dielectric window 18 and the upper end of the sidewall 12a, a sealing member SL1 may be interposed. The sealing member SL1 is, for example, an O-ring and configured to seal the processing chamber 12.

The plasma processing apparatus 10 further includes a mounting table 20. The mounting table 20 is provided within the processing chamber 12 and under the dielectric window 18. The mounting table 20 includes a plate 22 and an electrostatic chuck 24.

The plate 22 is a metallic member having a substantial disc shape and made of, for example, aluminum. The plate 22 is supported by a cylindrical supporting member SP1. The supporting member SP1 extends vertically upwards from the bottom portion 12b. The plate 22 serves as a high frequency electrode. The plate 22 is electrically connected to a high frequency power supply RFG, which generates high frequency bias power, via a matching unit MU and a power supply rod PFR. The high frequency power supply RFG supplies the high frequency bias power having a certain frequency of, for example, about 13.65 MHz suitable for controlling energy of ions attracted to the wafer W. The matching unit MU accommodates a matching device configured to match an impedance of the high frequency power supply RFG with a load impedance such as mainly an electrode, plasma, and the processing chamber 12. A blocking capacitor for generating self-bias is included within the matching device.

At an upper surface of the plate 22, the electrostatic chuck 24 is provided. The electrostatic chuck 24 includes a base plate 24a and a chuck portion 24b. The base plate 24a is a metallic member having a substantial disc shape and made of, for example, aluminum. The base plate 24a is provided on the plate 22. At an upper surface of the base plate 24a, the chuck portion 24b is provided. An upper surface of the chuck portion 24b serves as a mounting region MR on which the wafer W is mounted. The chuck portion 24b is configured to hold the wafer W with an electrostatic adsorptive force. The chuck portion 24b includes an electrode film interposed between dielectric films. The electrode film of the chuck portion 24b is electrically connected to a DC power supply DSC via a switch SW and a coated line CL. The chuck portion 24b attracts and holds the wafer W on an upper surface thereof with a Coulomb force generated by a DC voltage applied from the DC power supply DSC. A focus ring FR annularly surrounding an edge portion of the wafer W is provided diametrically outside the chuck portion 24b.

Within the base plate 24a, an annular coolant path 24g extending in a circumferential direction thereof is provided. A coolant, for example, cooling water, having a certain temperature is supplied from a chiller unit through pipes PP1 and PP3 to be circulated through the coolant path 24g. As a result, a process temperature of the wafer W on the chuck portion 24b can be controlled by a temperature of the coolant. Further, a heat transfer gas, for example, a He gas, is supplied between the upper surface of the chuck portion 24b and a rear surface of the wafer W from a heat transfer gas supply unit through a supply pipe PP2.

Around the mounting table 20, an annular exhaust path VL is formed. At a portion of the exhaust path VL in the axis line Z direction, an annular baffle plate 26 having multiple through holes is provided. The exhaust path VL is connected to an exhaust line 28 having an exhaust opening 28h. The exhaust line 28 is provided at the bottom portion 12b of the processing chamber 12. The exhaust line 28 is connected to an exhaust device 30. The exhaust device 30 includes a pressure controller and a vacuum pump such as a turbo molecular pump. The processing space S within the processing chamber 12 can be depressurized to a certain vacuum level by the exhaust device 30. Further, a gas can be exhausted from an outer periphery of the mounting table 20 through the exhaust path VL by operating the exhaust device 30.

Further, the plasma processing apparatus 10 may further include heaters HT, HS, HC, and HE as temperature controllers. The heater HT is provided within the ceiling portion 12c and annularly extends to surround an antenna 14. Further, the heater HS is provided within the sidewall 12a and annularly extends. The heater HC is provided within the base plate 24a. The heater HC is provided under a central portion of the mounting region MR, i.e., at a region through which the axis line Z is passed, within the base plate 24a. Furthermore, the heater HE is provided within the base plate 24a and annularly extends to surround the heater HC. The heater HE is provided under an outer periphery portion of the mounting region MR.

Further, the plasma processing apparatus 10 may further include the antenna 14, a coaxial waveguide 16, the dielectric window 18, a microwave generator 32, a tuner 34, a waveguide 36, and a mode converter 38. The microwave generator 32 is configured to generate a microwave having a frequency of, for example, about 2.45 GHz. The microwave generator 32 is connected to an upper portion of the coaxial waveguide 16 via the tuner 34, the waveguide 36 and the mode converter 38. A central axis line of the coaxial waveguide 16 is the axis line Z and extends along the axis line Z. In the example embodiment, a center of the mounting region MR of the mounting table 20 is positioned on the axis line Z.

The coaxial waveguide 16 includes an external conductor 16a and an internal conductor 16b. The external conductor 16a has a cylindrical shape extending along the axis line Z. A lower end of the external conductor 16a may be electrically connected to an upper portion of a cooling jacket 40 including a conductive surface. The internal conductor 16b is provided inside the external conductor 16a to be coaxial with the external conductor 16a. The internal conductor 16b has a cylindrical shape extending along the axis line Z. A lower end of the internal conductor 16b is connected to a slot plate 44 of the antenna 14.

In the example embodiment, the antenna 14 is a radial line slot antenna. The antenna 14 is positioned within the opening formed at the ceiling portion 12c and is also provided on an upper surface of the dielectric window 18. The antenna 14 includes a dielectric plate 42 and the slot plate 44. The dielectric plate 42 is configured to shorten a wavelength of a microwave and has a substantial disc shape. The dielectric plate 42 is made of, for example, quartz or alumina. The dielectric plate 42 is held between the slot plate 44 and a lower surface of the cooling jacket 40. Accordingly, the antenna 14 includes the dielectric plate 42, the slot plate 44 and the lower surface of the cooling jacket 40.

Figure 7:
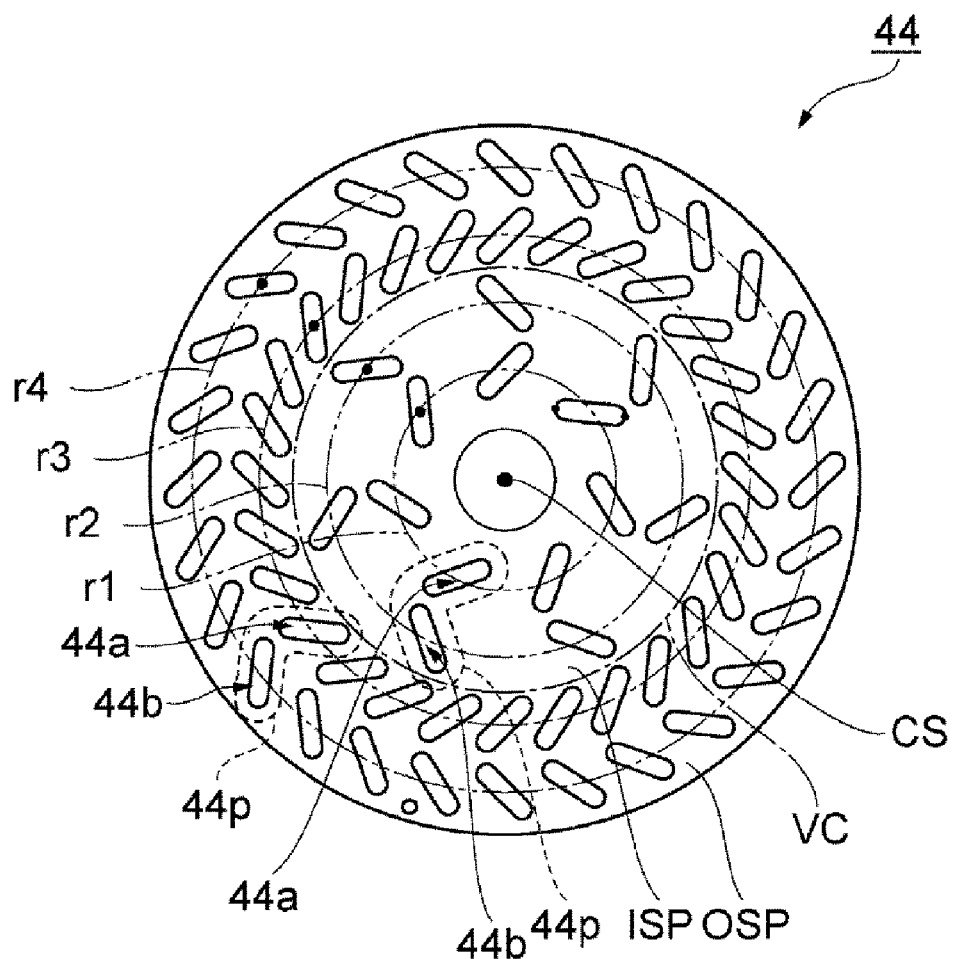
FIG. 7 is a plane view illustrating an example of a slot plate.

FIG. 7 is a plane view illustrating an example of the slot plate. The slot plate 44 has a thin plate shape and disc shape. Both surfaces of the slot plate 44 in a plate thickness direction are flat. A center CS of the circular slot plate 44 is positioned on the axis line Z. The slot plate 44 includes multiple slot pairs 44p. Each of the slot pairs 44p includes two slot holes 44a and 44b penetrating through the slot plate 44. Each of the slot holes 44a and 44b has an elongated hole shape when viewed from the plane. In each of the slot pairs 44p, a direction in which a major axis of the slot hole 44a extends and a direction in which a major axis of the slot hole 44b extends are intersected with each other or orthogonal to each other.

In the example embodiment as illustrated in FIG. 7, the multiple slot pairs 44p are divided into an inner slot pair group ISP arranged inside a virtual circle VC around the axis line Z and an outer slot pair group OSP arranged outside the virtual circle VC. The inner slot pair group ISP includes multiple slot pairs 44p. In the example embodiment as illustrated in FIG. 7, the inner slot pair group ISP includes seven slot pairs 44p. The multiple slot pairs 44p of the inner slot pair group ISP are equally spaced in a circumferential direction with respect to the center CS. Further, multiple slot holes 44a included in the inner slot pair group ISP are equally spaced such that centers of the slot holes 44a are positioned on a circle having a radius r1 from the center CS of the slot plate 44. Further, multiple slot holes 44b included in the inner slot pair group ISP are equally spaced such that centers of the slot holes 44b are positioned on a circle having a radius r2 from the center CS of the slot plate 44. Herein, the radius r2 is greater than the radius r1.

The outer slot pair group OSP includes multiple slot pairs 44p. In the example embodiment as illustrated in FIG. 7, the outer slot pair group OSP includes twenty eight slot pairs 44p. The multiple slot pairs 44p of the outer slot pair group OSP are equally spaced in the circumferential direction with respect to the center CS. Further, multiple slot holes 44a included in the outer slot pair group OSP are equally spaced such that centers of the slot holes 44a are positioned on a circle having a radius r3 from the center CS of the slot plate 44. Further, multiple slot holes 44b included in the outer slot pair group OSP are equally spaced such that centers of the slot holes 44b are positioned on a circle having a radius r4 from the center CS of the slot plate 44. Herein, the radius r3 is greater than the radius r2, and the radius r4 is greater than a radius r3.

Further, each slot hole 44a of the inner slot pair group ISP and the outer slot pair group OSP is arranged such that a long side thereof has the same angle with respect to a line segment connecting a center of each slot hole 44a and the center CS. Furthermore, each slot hole 44b of the inner slot pair group ISP and the outer slot pair group OSP is arranged such that the long side thereof has the same angle with respect to a line segment connecting a center of each slot hole 44b and the center CS.

Figure 8:
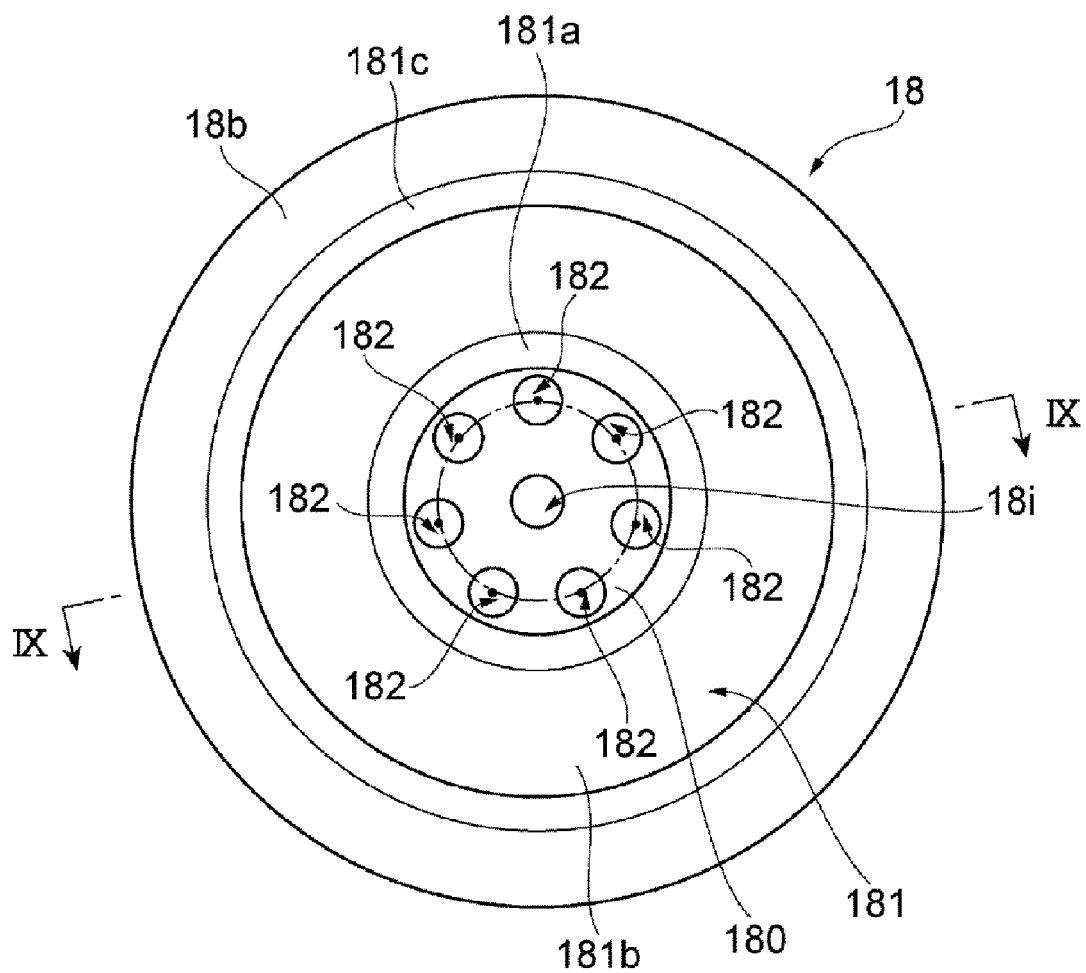
FIG. 8 is a plane view illustrating an example of a dielectric window.
Figure 9:
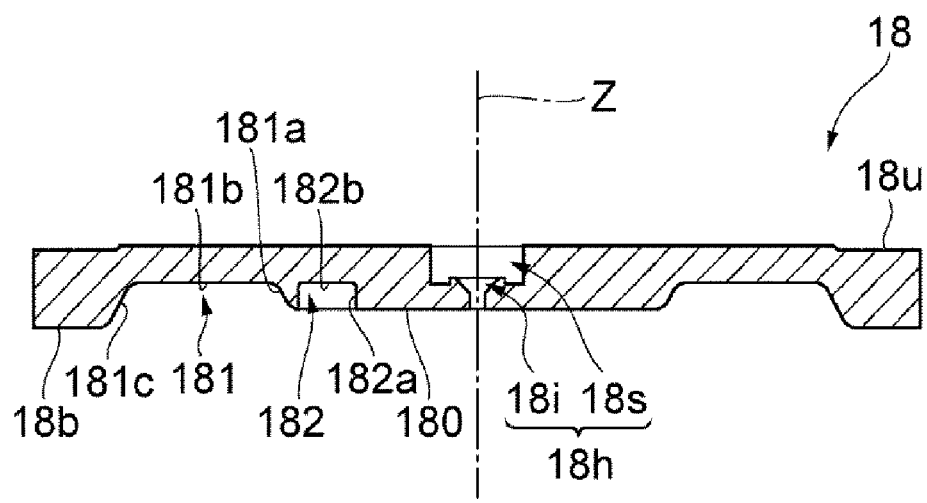
FIG. 9 is a cross sectional view taken along a line IX-IX of FIG. 8.

FIG. 8 is a plane view illustrating an example of a dielectric window, and illustrates a status of the dielectric window when viewed from the processing space S. FIG. 9 is a cross sectional view taken along a line IX-IX of FIG. 8. The dielectric window 18 has a substantial disc shape and is made of a dielectric material such as quartz or alumina. On an upper surface 18u of the dielectric window 18, the slot plate 44 is provided.

A through hole 18h is formed at a central portion of the dielectric window 18. An upper portion of the through hole 18h serves as a space 18s for accommodating an injector 50b of a central inlet unit 50 to be described later, and a lower portion thereof serves as a central inlet opening 18i of the central inlet unit 50 to be described later. Further, a central axis line of the dielectric window 18 is identical with the axis line Z.

An opposite surface to the upper surface 18u of the dielectric window, i.e., a lower surface 18b of the dielectric window is in contact with the processing space S and plasma is generated at the side of the lower surface 18b. In the lower surface 18b, various shapes are formed. To be specific, the lower surface 18b includes a planar surface 180 at a central portion surrounding the central inlet opening 18i. The planar surface 180 is a flat surface orthogonal to the axis line Z. In the lower surface 18b, a first recess portion 181 is annularly and continuously formed such that a sidewall thereof tapers upwardly in the plate thickness direction of the dielectric window 18.

The first recess portion 181 includes an inner tapered surface 181a, a bottom surface 181b, and an outer tapered surface 181c. The bottom surface 181b is formed at the side of the upper surface 18u rather than at the planar surface 180, and annularly extends in parallel with the planar surface 180. The inner tapered surface 181a annularly extends between the planar surface 180 and the bottom surface 181b, and is inclined with respect to the planar surface 180. Further, a periphery portion of the lower surface 18b is a surface in contact with the sidewall 12a.

Further, in the lower surface 18b, multiple second recess portions 182 are formed to be upwardly recessed in the plate thickness direction from the planar surface 180. The number of the multiple second recess portions 182 is seven in the example embodiment as illustrated in FIG. 8 and FIG. 9. These multiple second recess portions 182 are equally spaced along the circumferential direction thereof. Further, each of the multiple second recess portions 182 has a circular shape when viewed from the plane on a surface orthogonal to the axis line Z. To be specific, an inner surface 182a of the second recess portion 182 is a cylindrical surface extending in the axis line Z direction. Further, a bottom surface 182b of the second recess portion 182 is formed at the side of the upper surface 18u rather than at the planar surface 180, and is a circular surface parallel with the planar surface 180.

Figure 10:
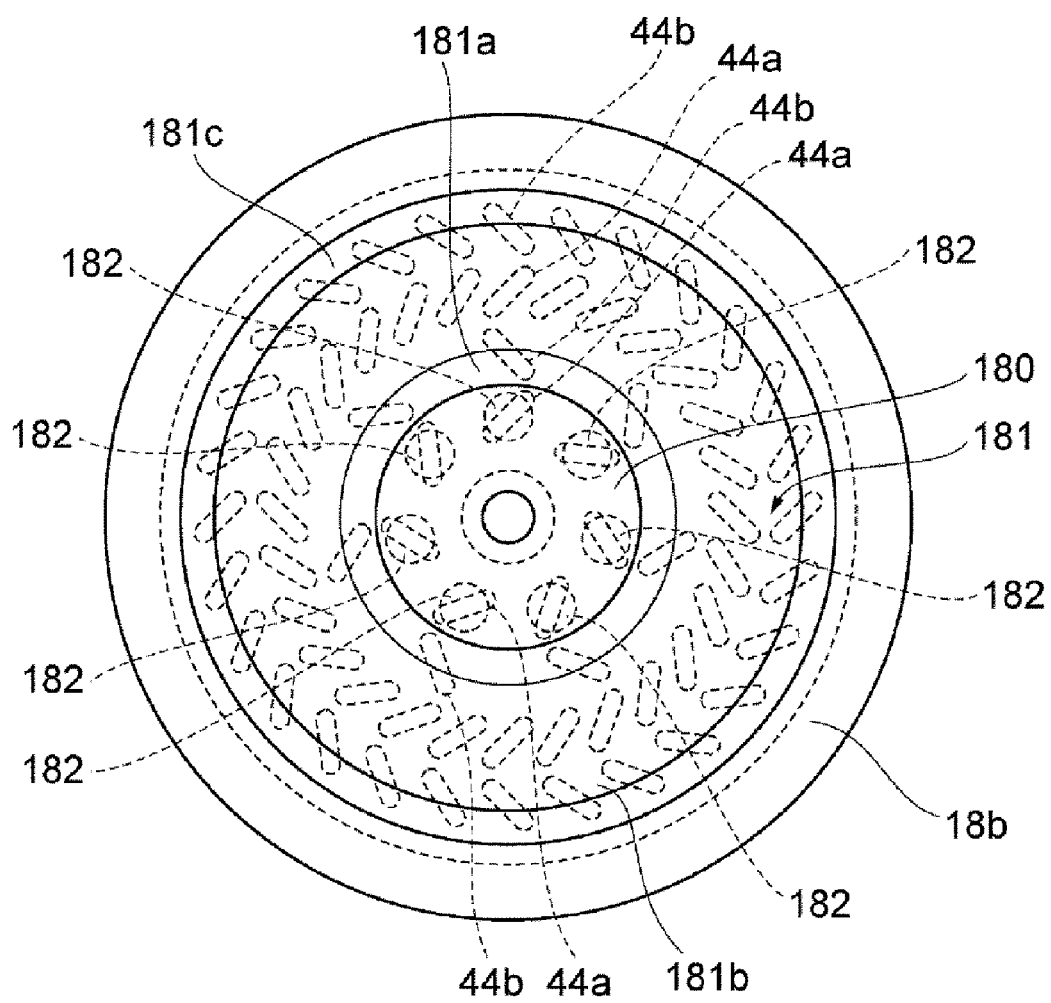
FIG. 10 is a plane view illustrating a status where the slot plate illustrated in FIG. 7 is provided on the dielectric window illustrated in FIG. 8.

FIG. 10 is a plane view illustrating a status where the slot plate illustrated in FIG. 7 is provided on the dielectric window illustrated in FIG. 8, and illustrates a status of the dielectric window 18 when viewed from the bottom. As illustrated in FIG. 10, when viewed from the plane, i.e., when viewed from the axis line Z direction, the multiple slot holes 44a and the multiple slot holes 44b of the outer slot pair group OSP, and the multiple slot holes 44b of the inner slot pair group ISP are overlapped with the first recess portion 181. To be specific, when viewed from the plane, a portion of each slot hole 44b of the outer slot pair group OSP is overlapped with the outer tapered surface 181c, and the other portion thereof is overlapped with the bottom surface 181b. Furthermore, when viewed from the plane, the multiple slot holes 44a of the outer slot pair group OSP are overlapped with the bottom surface 181b. Moreover, when viewed from the plane, a portion of each slot hole 44b of the inner slot pair group ISP is overlapped with the inner tapered surface 181a, and the other portion thereof is overlapped with the bottom surface 181b.

Further, when viewed from the plane, i.e., when viewed from the axis line Z direction, each of the multiple slot holes 44a of the inner slot pair group ISP is overlapped with each of the second recess portion 182. To be specific, when viewed from the plane, the center of the bottom surface of each second recess portion 182 is positioned within each slot hole 44a of the inner slot pair group ISP.

Referring to FIG. 6 again, in the plasma processing apparatus 10, a microwave generated by the microwave generator 32 is propagated toward the dielectric plate 42 through the coaxial waveguide 16, and is applied to the dielectric window 18 from the slot holes 44a and 44b of the slot plate 44.

In the dielectric window 18, as described above, a plate thickness of a portion in which the first recess portion 181 is formed and a plate thickness of a portion in which the second recess portion 182 is formed are smaller than a plate thickness of the other portions. Therefore, in the dielectric window 18, a microwave transmittance becomes high at these portions in which the first recess portions 181 and the second recess portions 182 are formed. Further, when viewed from the axis line Z direction, the slot holes 44a and 44b of the outer slot pair group OSP and the slot holes 44b of the inner slot pair group ISP are overlapped with the first recess portion 181, and each of the slot holes 44a of the inner slot pair group ISP is overlapped with each of the second recess portion 182. Therefore, electric fields of the microwave are concentrated on the first recess portion 181 and the second recess portions 182, so that microwave energy is concentrated on the first recess portion 181 and the second recess portions 182. As a result, it is possible to stably generate plasma at the first recess portion 181 and the second recess portions 182, and also possible to allow plasma right under the dielectric window 18 to be stably distributed in the diametrical direction and the circumferential direction.

Further, the plasma processing apparatus 10 includes the central inlet unit 50 and a peripheral inlet unit 52. The central inlet unit 50 includes a pipe 50a, the injector 50b, and the central inlet opening 18i. The pipe 50a passes through an inner hole of the internal conductor 16b of the coaxial waveguide 16. Further, an end of the pipe 50a extends to the inside of the space 18s (see FIG. 9) of the dielectric window 18 along the axis line Z. Within the space 18s and under the end of the pipe 50a, the injector 50b is provided. The injector 50b includes multiple through holes extending in the axis line Z direction. Further, in the dielectric window 18, the central inlet opening 18i is formed. The central inlet opening 18i is continuous under the space 18s and extends along the axis line Z. The central inlet unit 50 described above is configured to supply a gas to the injector 50b through the pipe 50a and discharges the gas from the injector 50b through the central inlet opening 18i. As such, the central inlet unit 50 discharges the gas toward right under the dielectric window 18 along the axis line Z. That is, the central inlet unit 50 introduces the gas to a plasma generation region having a high electron temperature.

The peripheral inlet unit 52 includes multiple peripheral inlet openings 52i. The multiple peripheral inlet openings 52i mainly supply a gas toward an edge portion of the wafer W. The multiple peripheral inlet openings 52i are oriented to the edge portion of the wafer W or a periphery portion of the mounting region MR. The multiple peripheral inlet openings 52i are arranged along the circumferential direction between the central inlet opening 18i and the mounting table 20. That is, the multiple peripheral inlet openings 52i are annularly arranged around the axis line Z at a region (plasma diffusion region) having a lower electron temperature than right under the dielectric window. The peripheral inlet unit 52 supplies a gas toward the wafer W from the region having the low electron temperature. Therefore, it is possible to allow a dissociation degree of the gas introduced into the processing space S from the peripheral inlet unit 52 to be lower than a dissociation degree of the gas introduced into the processing space S from the central inlet unit 50.

Figure 11:
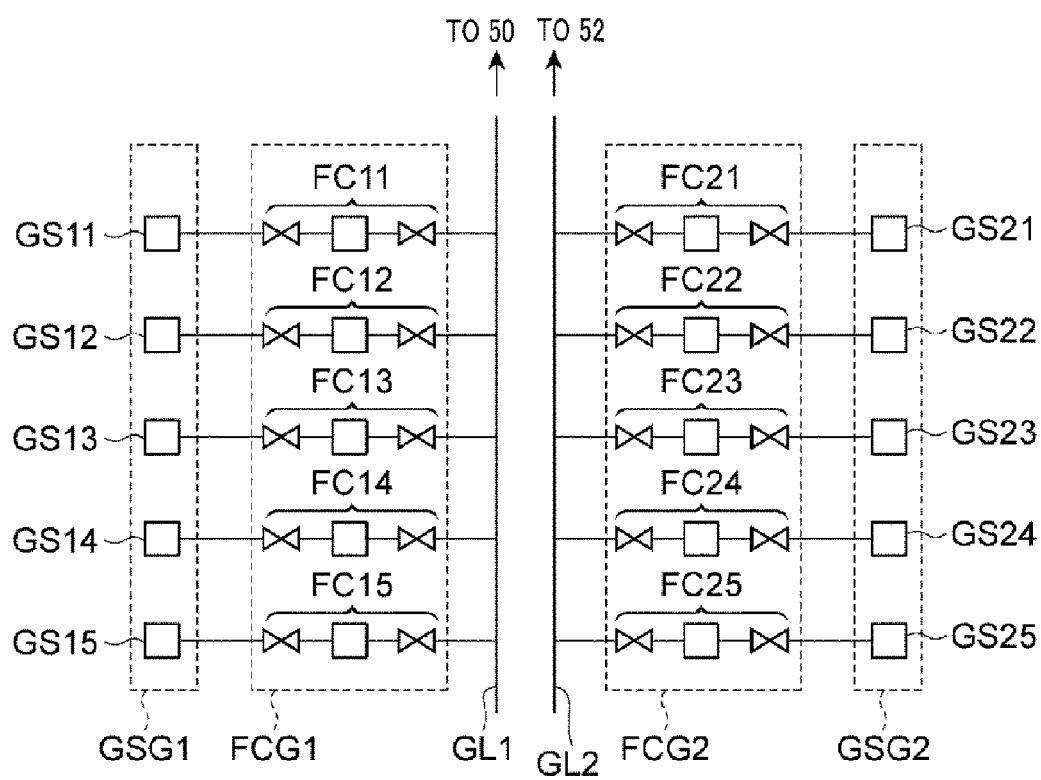
FIG. 11 illustrates a gas supply system including a first flow rate control unit group, a first gas source group, a second flow rate control unit group, and a second gas source group.

The central inlet unit 50 is connected to a first gas source group GSG1 via a first flow rate control unit group FCG1. Further, the peripheral inlet unit 52 is connected to a second gas source group GSG2 via a second flow rate control unit group FCG2. FIG. 11 illustrates a gas supply system including the first flow rate control unit group, the first gas source group, the second flow rate control unit group, and the second gas source group. As illustrated in FIG. 11, the first gas source group GSG1 includes multiple first gas sources GS11 to GS15. The first gas sources GS11 to GS15 are an Ar gas source, a He gas source, a $C_4H_6$ gas source, a $CH_3F$ gas source, and an $O_2$ gas source, respectively. The first gas source group GSG1 may further include a gas source different from these gas sources.

The first flow rate control unit group FCG1 includes multiple first flow rate control units FC11 to FC15. Each of the multiple first flow rate control units FC11 to FC15 includes, for example, two valves and a flow rate controller provided between the two valves. The flow rate controller is, for example, a mass flow controller. The multiple first gas sources GS11 to GS15 are connected to a common gas line GL1 via the multiple first flow rate control units FC11 to FC15, respectively. The common gas line GL1 is connected to the central inlet unit 50.

The second gas source group GSG2 includes multiple second gas sources GS21 to GS25. The second gas sources GS21 to GS25 are an Ar gas source, a He gas source, a $C_4H_6$ gas source, a $CH_3F$ gas source, and an $O_2$ gas source, respectively. The second gas source group GSG2 may further include a gas source different from these gas sources.

The second flow rate control unit group FCG2 includes multiple second flow rate control units FC21 to FC25. Each of the multiple second flow rate control units FC21 to FC25 includes, for example, two valves and a flow rate controller provided between the two valves. The flow rate controller is, for example, a mass flow controller. The multiple second gas sources GS21 to GS25 are connected to a common gas line GL2 via the multiple second flow rate control units FC21 to FC25, respectively. The common gas line GL2 is connected to the peripheral inlet unit 52.

As such, in the plasma processing apparatus 10, the multiple first gas sources and the multiple first flow rate control units are provided only for the central inlet unit 50. Further, the multiple second gas sources and the multiple second flow rate control units, which are independent of these multiple first gas sources and multiple first flow rate control units, are provided only for the peripheral inlet unit 52. Therefore, it is possible to independently control a kind of a gas to be introduced into the processing space S from the central inlet unit 50 and a flow rate of one or more gases to be introduced into the processing space S from the central inlet unit 50. Further, it is also possible to independently control a kind of a gas to be introduced into the processing space S from the peripheral inlet unit 52 and a flow rate of one or more gases to be introduced into the processing space S from the peripheral inlet unit 52.

In the example embodiment, the plasma processing apparatus 10 may further include a control unit Cnt as illustrated in FIG. 6. The control unit Cnt may be a control device such as a programmable computer device. The control unit Cnt may control each component of the plasma processing apparatus 10 according to a program based on a recipe. By way of example, the control unit Cnt may transmit control signals to the multiple first flow rate control units FC11 to FC15 to control a kind of a gas and a flow rate of the gas to be supplied to the central inlet unit 50. Further, the control unit Cnt may transmit control signals to the multiple second flow rate control units FC21 to FC25 to control a kind of a gas and a flow rate of the gas to be supplied to the peripheral inlet unit 52. Furthermore, the control unit Cnt may supply control signals to the microwave generator 32, the high frequency power supply RFG, and the exhaust device 30 to control the microwave power, power and ON/OFF of RF bias, and a pressure within the processing chamber 12. Moreover, the control unit Cnt may transmit control signals to the heater power supply connected to the heaters HT, HS, HC, and HE to adjust temperatures of these heaters.

In the example embodiment, the peripheral inlet unit 52 may further include an annular line 52p. This annular line 52p includes multiple peripheral inlet openings 52i. The annular line 52p may be made of, for example, quartz. As illustrated in FIG. 6, the annular line 52p is provided along an inner surface of the sidewall 12a in the example embodiment. In other words, the annular line 52p is not provided at a lower surface of the dielectric window 18 and the mounting region MR, i.e., on a path connected to the wafer W. Therefore, the annular line 52p does not suppress diffusion of plasma. Further, since the annular line 52p is provided along the inner surface of the sidewall 12a, damage of the annular line 52p caused by plasma can be suppressed and a frequency of exchanging the annular line 52p can be reduced. Furthermore, since the annular line 52p is provided along the sidewall 12a of which a temperature can be controlled by a heater, it is possible to improve stability of a temperature of a gas to be introduced into the processing space S from the peripheral inlet unit 52.

Further, in the example embodiment, the multiple peripheral inlet openings 52i are open to the edge portion of the wafer W. That is, the multiple peripheral inlet openings 52i are inclined with respect to the flat surface orthogonal to the axis line Z to discharge a gas toward the edge portion of the wafer W. Since the peripheral inlet openings 52i are inclined and open to the edge portion of the wafer W as such, active species of the gas discharged from the peripheral inlet openings 52i directly head toward the edge portion of the wafer W. Thus, the active species of the gas can be supplied to the edge portion of the wafer W without being deactivated. As a result, it is possible to reduce nonuniformity in a processing rate of each portion in a diametrical direction of the wafer W.

Hereinafter, there will be explained an experimental example carried out to evaluate the method MT1 using the plasma processing apparatus 10. Further, the example embodiments are not limited to the experimental example.

EXPERIMENTAL EXAMPLE 1

In an experimental example 1, a target object including a silicon oxide ($SiO_2$) film uniformly formed on a substrate is processed for various processing times of about 5 seconds, about 10 seconds, and about 15 seconds in the plasma processing apparatus 10. Further, a target object including a polycrystalline silicon (Poly-Si) film uniformly formed on a substrate is processed for various processing times of about 5 seconds, about 10 seconds, and about 15 seconds in the plasma processing apparatus 10. The other processing conditions of the experimental example 1 are as follows.

Processing Conditions of Experimental Example 1

Pressure within the processing chamber 12: 40 mT (5.33 Pa)
Microwave: 2.45 GHz, 1500 W
High frequency bias power: 13.65 MHz, 350 W
Processing gas
    Flow rate of Ar gas: 600 sccm
    Flow rate of He gas: 600 sccm
    Flow rate of $C_4H_6$ gas: 20 sccm
    Flow rate of $O_2$ gas: 3 sccm
Wafer temperature: 50° C.

Figure 12A:
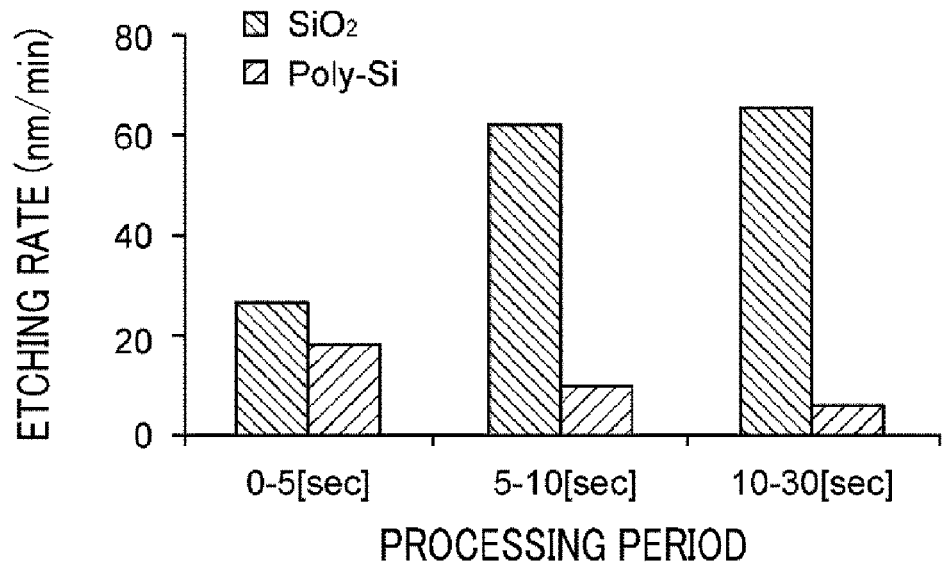
FIG. 12A and FIG. 12B show evaluation results of an experimental example 1.
Figure 12B:
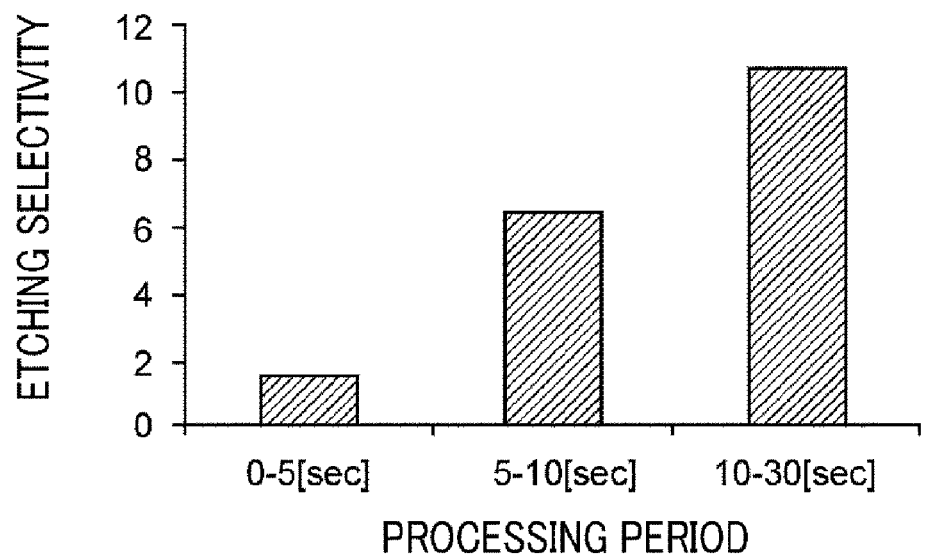

Further, in the experimental example 1, etching rates of the silicon oxide film during respective periods of about 0 second to about 5 seconds, about 5 seconds to about 10 seconds, and about 10 seconds to about 30 seconds are calculated, and etching rates of the polycrystalline silicon film during respective periods of about 0 second to about 5 seconds, about 5 seconds to about 10 seconds, and about 10 seconds to about 30 seconds are calculated. Furthermore, based on the calculated etching rates of the silicon oxide film and the calculated etching rates of the polycrystalline silicon film, ratios of the silicon oxide film etching rates to the polycrystalline silicon film etching rates, i.e., etching selectivities, during respective periods of about 0 second to about 5 seconds, about 5 seconds to about 10 seconds, and about 10 seconds to about 30 seconds are calculated. A result thereof is as shown in FIG. 12A and FIG. 12B. FIG. 12A shows the etching rates of the silicon oxide ($SiO_2$) film during respective periods of about 0 second to about 5 seconds, about 5 seconds to about 10 seconds, and about 10 seconds to about 30 seconds, and the etching rate of the polycrystalline silicon film during respective periods of about 0 second to about 5 seconds, about 5 seconds to about 10 seconds, and about 10 seconds to about 30 seconds. Further, FIG. 12B shows the etching selectivities during respective periods of about 0 second to about 5 seconds, about 5 seconds to about 10 seconds, and about 10 seconds to about 30 seconds.

As shown in FIG. 12A, during the period of about 0 second to about 5 seconds, a difference between the etching rate of the polycrystalline silicon film and the etching rate of the silicon oxide film is small, but after about 5 seconds, the etching rate of the silicon oxide film is increased with respect to the etching rate of the polycrystalline silicon film. Therefore, as shown in FIG. 12B, it is confirmed that the etching selectivity of the silicon oxide film with respect to the polycrystalline silicon film is low during the period of about 0 second to about 5 seconds, but is increased after about 5 seconds.

EXPERIMENTAL EXAMPLE 2

In an experimental example 2, a substrate having a flat surface is processed for various processing times of about 5 seconds, about 10 seconds, and about 15 seconds in the plasma processing apparatus 10. The processing conditions of the experimental example 2 are as follows.

Processing Conditions of Experimental Example 2

Pressure within the processing chamber 12: 40 mT (5.33 Pa)
Microwave: 2.45 GHz, 1500 W
High frequency bias power: 13.65 MHz, 0 W
Processing gas:
    Flow rate of Ar gas: 600 sccm
    Flow rate of He gas: 600 sccm
    Flow rate of $C_4H_6$ gas: 20 sccm or 30 sccm
    Flow rate of $O_2$ gas: 3 sccm
Wafer temperature: 50° C.

Figure 13:
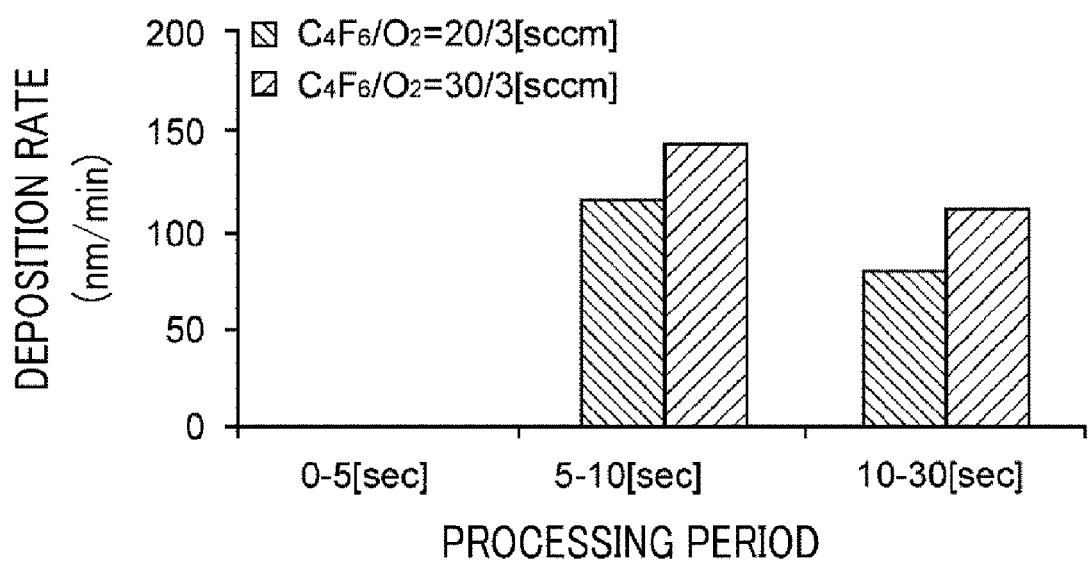
FIG. 13 shows evaluation results of an experimental example 2.

Further, based on a thickness of a film deposited on the substrate, deposition rates of fluorocarbon active species during respective periods of about 0 second to about 5 seconds, about 5 seconds to about 10 seconds, and about 10 seconds to about 30 seconds are calculated. A result thereof is as shown in FIG. 13. As shown in FIG. 13, during the period of 0 second to about 5 seconds, in both cases where a flow rate of the $C_4H_6$ gas is about 20 sccm (expressed as "$C_4H_6/O_2$=20/3 [sccm]" in FIG. 13) and where a flow rate of the $C_4H_6$ gas is about 30 sccm (expressed as "$C_4H_6/O_2$=30/3 [sccm]" in FIG. 13), a deposition rate is about 0. Furthermore, it is found that after about 5 seconds, a deposition rate has a meaningful value. As a result of this, it is found that during an initial time period of a plasma process only with a fluorocarbon gas, a protective film from the fluorocarbon active species is not formed, so that a region formed of silicon to be protected is etched during the initial time period.

EXPERIMENTAL EXAMPLE 3

In an experimental example 3, a substrate having a flat surface is processed for various processing times of about 5 seconds, about 10 seconds, and about 15 seconds in the plasma processing apparatus 10. The processing conditions of the experimental example 3 are as follows.

Processing Conditions of Experimental Example 3

Pressure within the processing chamber 12: 40 mT (5.33 Pa)
Microwave: 2.45 GHz, 1500 W
High frequency bias power: 13.65 MHz, 0 W
Processing gas:
    Flow rate of Ar gas: 600 sccm
    Flow rate of He gas: 600 sccm
    Flow rate of $C_4H_6$ gas: 20 sccm
    Flow rate of $CH_3F$ gas: 45 sccm
    Flow rate of $O_2$ gas: 35 sccm
Wafer temperature: 50° C.

Figure 14:
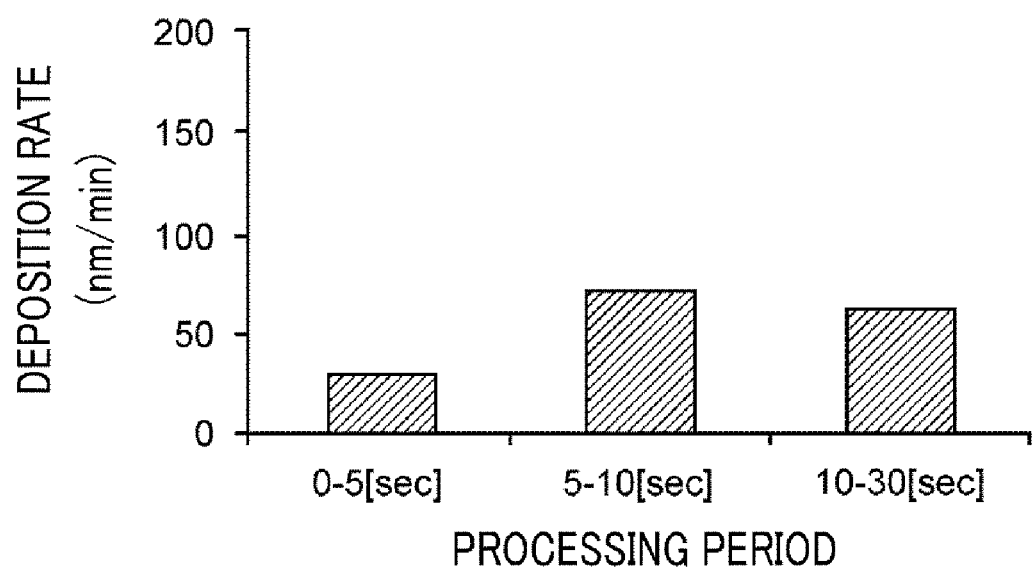
FIG. 14 shows evaluation results of an experimental example 3.

Further, based on a thickness of a film deposited on the substrate, deposition rates of fluorocarbon active species during respective periods of about 0 second to about 5 seconds, about 5 seconds to about 10 seconds, and about 10 seconds to about 30 seconds are calculated. A result thereof is as shown in FIG. 14. As can be seen clearly from the graph of FIG. 14, since the $CH_3F$ gas is included in the processing gas together with the $C_4H_6$ gas, it is found that during the period of 0 second to about 5 seconds, i.e., during the initial time period, a deposition rate having a meaningful value is obtained. That is, since the $CH_3F$ gas is included in the processing gas together with the $C_4H_6$ gas, during the initial time period of the plasma process, it is found that the protective film can be formed on the target object, so that it is possible to suppress the region formed of silicon from being etched.

EXPERIMENTAL EXAMPLE 4 AND COMPARATIVE EXPERIMENTAL EXAMPLE 1

In an experimental example 4, the method MT1 using the plasma processing apparatus 10 is carried out to a target object, i.e., a wafer including the first region (fin region) R1 and the second region R2 as illustrated in FIG. 2. Further, in a comparative experimental example 1, only the process ST2 using the plasma processing apparatus 10 is carried out to the target object, i.e., the same wafer as used in the experimental example 4. The processing conditions of the experimental example 4 and the processing conditions of the comparative experimental example 1 are as follows.

Processing Conditions of Experimental Example 4

Process ST1
Pressure within the processing chamber 12: 40 mT (5.333 Pa)
Microwave: 2.45 GHz, 1500 W
High frequency bias power: 13.65 MHz, 350 W
Processing gas:
   Flow rate of Ar gas: 400 sccm
   Flow rate of He gas: 900 sccm
   Flow rate of $C_4H_6$ gas: 20 sccm
   Flow rate of $CH_3F$ gas: 25 sccm
   Flow rate of $O_2$ gas: 10 sccm
Wafer temperature: 50° C.
Processing time: 2 seconds
Process ST2
Pressure within the processing chamber 12: 40 mT (5.333 Pa)
Microwave: 2.45 GHz, 1500 W
High frequency bias power: 13.65 MHz, 350 W
Processing gas:
   Flow rate of Ar gas: 400 sccm
   Flow rate of He gas: 900 sccm
   Flow rate of $C_4H_6$ gas: 20 sccm
   Flow rate of $CH_3F$ gas: 0 sccm
   Flow rate of $O_2$ gas: 3 sccm
Wafer temperature: 50° C.
Processing time: 28 seconds Processing Conditions of Process ST2 in Comparative Experimental Example 1

Figure 15A:
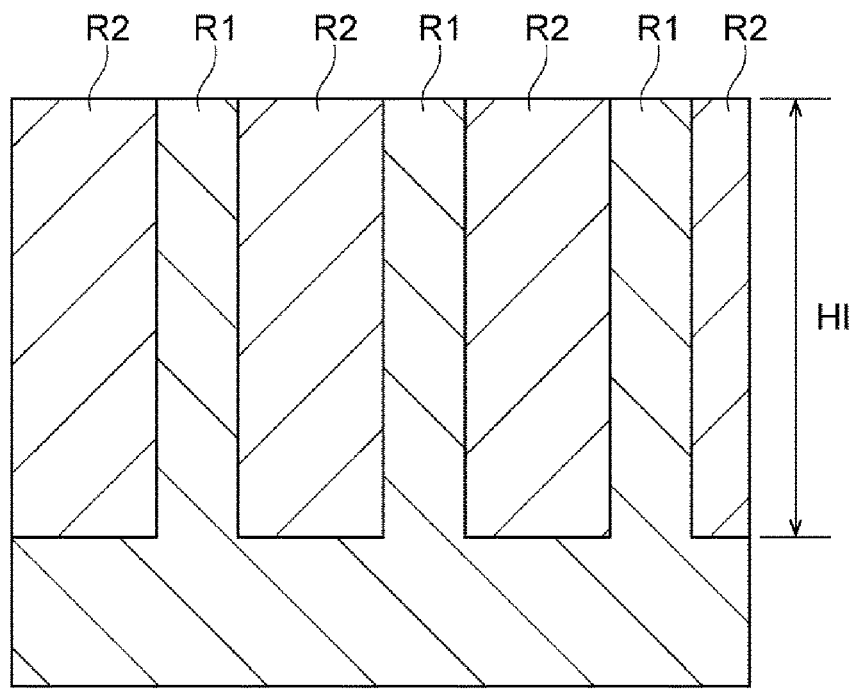
FIG. 15A and FIG. 15B are diagrams for explaining evaluation of an experimental example 4.
Figure 15B:
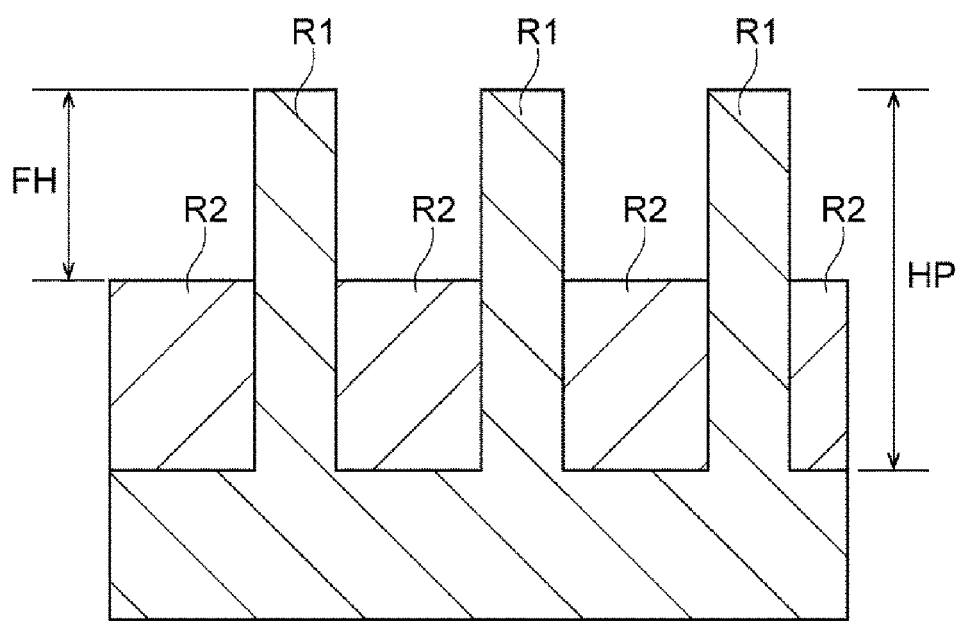

Pressure within the processing chamber 12: 40 mT (5.333 Pa)
Microwave: 2.45 GHz, 1500 W
High frequency bias power: 13.65 MHz, 350 W
Processing gas:
   Flow rate of Ar gas: 400 sccm
   Flow rate of He gas: 900 sccm
   Flow rate of $C_4H_6$ gas: 20 sccm
   Flow rate of $CH_3F$ gas: 0 sccm
   Flow rate of $O_2$ gas: 3 sccm
Wafer temperature: 50° C.
Processing time: 30 seconds Further, with respect to each of the experimental example 4 and the comparative experimental example 1, based on a difference between a height HI (see FIG. 15A) of the first region R1 before performing the process and a height HP (see FIG. 15B) of the first region R1 after performing the process, a decrement in height of the first region R1 is obtained. Furthermore, with respect to each of the experimental example 4 and the comparative experimental example 1, a difference FH (see FIG. 15B) between a height of an upper end surface of the second region R2 and a height of an upper end surface of the first region R1 after performing the process is obtained. As a result, in the experimental example 4, the decrement in height of the first region R1 is about 1.6 nm, and the difference FH between the height of the upper end surface of the second region R2 and the height of the upper end surface of the first region R1 is about 42.5 nm. Meanwhile, in the comparative experimental example 1, the decrement in height of the first region R1 is about 10.7 nm, and the difference FH between the height of the upper end surface of the second region R2 and the height of the upper end surface of the first region R1 is about 39.4 nm. Thus, in the experimental example 4, etching of the first region R1 is suppressed and the second region R2 is selectively etched with respect to the first region R1. As a result, it is found that by using the method MT1, it is possible to suppress the first region formed of silicon from being etched, and also possible to selectively etch the second region formed of silicon oxide.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An etching method of selectively etching a second region formed of silicon oxide in a target object with respect to a first region formed of silicon in the target object, a side surface of the second region being in contact with a side surface of the first region, the etching method comprising:

processing the target object with plasma of a first processing gas containing fluorocarbon and fluorohydrocarbon by generating the plasma of the first processing gas with a microwave and forming a protective film on the first region and the second region; and after the processing of the target object with the plasma of the first processing gas and forming the protective film, processing the target object with plasma of a second processing gas containing fluorocarbon by generating the plasma of the second processing gas with the microwave.

2. The etching method of claim 1,
wherein the second processing gas does not contain fluorohydrocarbon.

3. The etching method of claim 1,
wherein the fluorohydrocarbon includes at least one of $CH_3F$ and $CH_2F_2$.

4. The etching method of claim 1,
wherein the first region is a fin region of a fin-type field effect transistor and the second region is formed around the fin region.

5. An etching method comprising:
preparing a target object including a first region formed of silicon and a second region formed of silicon oxide;
processing the target object with plasma of a first processing gas containing fluorocarbon and fluorohydrocarbon by generating the plasma of the first processing gas with a microwave;
forming a first protective film on the first region and the second region by $C_xF_{y-n}$ active species (x, y and n are integer);
processing the target object with plasma of a second processing gas containing fluorocarbon by generating the plasma of the second processing gas with the microwave; and forming a second protective film on the first region and the second region by second $C_xF_y$ active species (x and y are integer).

6. The etching method of claim 5,
wherein the second processing gas does not contain fluorohydrocarbon.

7. The etching method of claim 5,
wherein the fluorohydrocarbon includes at least one of $CH_3F$ and $CH_2F_2$.

8. The etching method of claim 5,
wherein the first region is a fin region of a fin-type field effect transistor and the second region is formed around the fin region.

9. The etching method of claim 5,
wherein generating the plasma of the first processing gas with a microwave comprises generating first $C_xF_y$ active species (x and y are integer) by dissociation of the fluorocarbon in the first processing gas and generating hydrogen active species by dissociation of the fluorohydrocarbon, and generating the $C_xF_{y-n}$ active species (x, y and n are integer) by bonding the hydrogen active species to the first $C_xF_y$ active species.

10. The etching method of claim 5,
wherein generating the plasma of the second processing gas with the microwave comprises generating the second $C_xF_y$ active species (x and y are integer) by dissociation of the fluorocarbon in the second processing gas.

\* \* \* \* \*